(12) United States Patent
Matsuura et al.

(10) Patent No.: US 7,119,547 B2
(45) Date of Patent: Oct. 10, 2006

(54) TESTING APPARATUS

(75) Inventors: Kunihiro Matsuura, Tokyo (JP); Hiroki Ando, Tokyo (JP); Hironori Tanaka, Tokyo (JP); Yasuhiro Urabe, Tokyo (JP); Satoshi Kodera, Tokyo (JP)

(73) Assignee: Advantest Corporation, Tokyo (JP)

( * ) Notice: Subject to any disclaimer, the term of this patent is extended or adjusted under 35 U.S.C. 154(b) by 176 days.

(21) Appl. No.: 10/776,030

(22) Filed: Feb. 10, 2004

(65) Prior Publication Data
US 2005/0174105 A1    Aug. 11, 2005

(51) Int. Cl.
*G01R 31/02* (2006.01)
*G01R 31/00* (2006.01)

(52) U.S. Cl. .................................. 324/537; 324/158.1

(58) Field of Classification Search ..................... None
See application file for complete search history.

(56) References Cited

U.S. PATENT DOCUMENTS

| | | | | |
|---|---|---|---|---|
| 1,860,052 | A | * | 5/1932 | Peterson ..................... 343/905 |
| 3,054,948 | A | * | 9/1962 | Rymaszewski .............. 324/629 |
| 4,985,672 | A | * | 1/1991 | Hashimoto et al. ......... 324/537 |
| 5,014,012 | A | * | 5/1991 | Kuboyama et al. ......... 324/720 |
| 5,379,006 | A | * | 1/1995 | McCorkle .................... 333/26 |
| 5,463,323 | A | * | 10/1995 | Wakamatsu ................. 324/611 |
| 6,275,023 | B1 | * | 8/2001 | Oosaki et al. ........... 324/158.1 |

FOREIGN PATENT DOCUMENTS

| | | |
|---|---|---|
| JP | 5-69690 | 9/1993 |
| JP | 6-342033 | 12/1994 |

OTHER PUBLICATIONS

Patent Abstracts of Japan, Publication No.: 06-342033, Publication Date: Dec. 13, 1994, 2 pages.
PCT International Search Report for PCT Application No.: PCT/JP2005/001934 mailed on May 24, 2005, 6 pages.

* cited by examiner

*Primary Examiner*—Paresh Patel
(74) *Attorney, Agent, or Firm*—Osha Liang LLP

(57) ABSTRACT

A testing apparatus includes a first power supply unit and first and second coaxial cables. The first power supply supplies current to a device under test. The first coaxial cable includes a first internal conductor and a first external conductor. The second coaxial cable includes a second internal conductor and a second external conductor. The first internal conductor and the second external conductor conducts current from the first power supply unit to the device under test. The second internal conductor and the first external conductor conducts current from the device under test to the first power supply unit.

8 Claims, 8 Drawing Sheets

TESTING APPARATUS

BACKGROUND OF THE INVENTION

1. Field of the Invention

The present invention relates to a testing apparatus. More particularly, the present invention relates to a testing apparatus performing a test by supplying a current to a device under test.

2. Description of the Related Art

Recently, as highly integrated and high speed semiconductor devices have been realized, low voltage and high current devices are rapidly being developed. Accordingly, also in a testing apparatus for performing a test on a semiconductor device, it is required to operate with high performance, high speed load response, and high efficiency and to respond to low voltage and high current.

FIG. 1 shows an equivalent circuit of a testing apparatus 100 according to the prior art. And, FIG. 2 shows the frequency response characteristics of a voltage $V_0$ applied to a device under test 104 by the testing apparatus 100 shown in FIG. 1. The testing apparatus 100 adopts a voltage output amplifier 102, and performs a test of the device under test 104 by applying the voltage $V_0$ to the device under test 104. Here, since the gain bandwidth (GBW) product of the voltage output amplifier 102 is calculated by $1/(2\pi RC)$ [Hz], it is considered that the resistance R should be small for realizing a high speed test. However, it is difficult to lower the resistance R sufficiently in the testing apparatus 100 adopting the voltage output amplifier 102, and thus the high speed test is restricted and the high speed load response cannot be realized sufficiently.

SUMMARY OF THE INVENTION

Therefore, it is an object of the present invention to provide a testing apparatus, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a testing apparatus for testing a device under test by supplying a current to the device under test, includes a first power supply unit for generating a current to be supplied to the device under test and first and second coaxial cables through which the current generated by the first power supply unit is supplied to the device under test, wherein the first power supply unit includes a current detecting unit for detecting an amount of a voltage drop when the current generated by the first power supply unit passes through a predetermined resistor and a current controlling unit for controlling the current being supplied to the device under test in response to the amount of the voltage drop detected by the current detecting unit, the first coaxial cable includes a first internal conductor for conducting the current from the first power supply unit towards the device under test and a first external conductor provided around the first internal conductor with an insulator interposed therebetween for conducting the current from the device under test towards the first power supply unit, and the second coaxial cable includes a second internal conductor for conducting the current from the device under test towards the first power supply unit and a second external conductor around the first internal conductor with an insulator interposed therebetween for conducting the current from the first power supply unit towards the device under test.

The current controlling unit may control the current supplied to the device under test so as to negate the amount of the voltage drop caused by the predetermined resistor.

The testing apparatus may further include a voltage detecting unit for comparing a voltage to be applied to the device under test with a voltage being practically applied to the device under test and outputting a comparison result thereof, wherein the current controlling unit may control the current supplied to the device under test further based on the comparison result outputted by the voltage detecting unit.

The first internal and second external conductors may be coupled in parallel to each other and conduct the current from the first power supply unit towards the device under test, and the first external and second internal conductors may be coupled in parallel to each other and conduct the current from the device under test towards the first power supply unit.

The testing apparatus may further include a second power supply unit with a same configuration as that of the first power supply unit for generating a current to be supplied to the device under test, third and fourth coaxial cables through which the current generated by the second power supply unit is supplied to the device under test, a multi-layer substrate on which the first and second power supply units are provided, a first wiring pattern formed at the multi-layer substrate for electrically coupling the first power supply unit to the first and second coaxial cables, and a second wiring pattern formed at the multi-layer substrate for electrically coupling the second power supply unit to the third and fourth coaxial cables, wherein the third coaxial cable may include a third internal conductor for conducting the current from the second power supply unit towards the device under test and a third external conductor provided around the third internal conductor with an insulator interposed therebetween for conducting the current from the device under test towards the second power supply unit, the fourth coaxial cable may include a fourth internal conductor for conducting the current from the device under test towards the second power supply unit and a fourth external conductor provided around the fourth internal conductor with an insulator interposed therebetween for conducting the current from the second power supply unit towards the device under test, the first wiring pattern may include a first feed pattern formed at a layer of the multi-layer substrate for conducting the current from the first power supply unit towards the first internal and second external conductors and a first ground pattern for conducting the current from the first external and second internal conductors towards the first power supply unit, the first ground pattern being formed at a layer of the multi-layer substrate adjacent to the layer in order that the first ground pattern faces the first feed pattern, the first ground pattern having a same width as that of the first feed pattern, and the second wiring pattern may include a second feed pattern formed at a layer of the multi-layer substrate for conducting the current from the second power supply unit towards the third internal and fourth external conductors and a second ground pattern for conducting the current from the third external and fourth internal conductors towards the second power supply unit, the second ground pattern being formed at a layer of the multi-layer substrate adjacent to the layer in order that the second ground pattern faces the second feed pattern, the second ground pattern having a same width as that of the second feed pattern.

The first and second feed patterns may be formed at a first layer of the multi-layer substrate, and the first and second ground patterns may be formed at a second layer of the multi-layer substrate, the second layer being adjacent to the first layer with an insulation layer interposed therebetween.

Each of the first and second power supply units may apply a first same voltage to each of the first and second feed patterns, and a second same voltage to each of the first and second ground patterns.

The testing apparatus may further include a performance board for coupling the first to fourth coaxial cables electrically, wherein the performance board may electrically couple the first internal and second external conductors to the third internal and fourth external conductors, and the first external and second internal conductors to the third external and fourth internal conductors.

According to the second aspect of the present invention, a testing apparatus for testing a device under test by supplying a current to the device under test, includes first and second power supply units for generating a current to be supplied to the device under test, a multi-layer substrate on which the first and second power supply units are provided, a first wiring pattern formed at the multi-layer substrate for electrically coupling the first power supply unit to the device under test, and a second wiring pattern formed at the multi-layer substrate for electrically coupling the second power supply unit to the device under test, wherein the first wiring pattern includes a first feed pattern formed at a layer of the multi-layer substrate for conducting the current from the first power supply unit towards the device under test and a first ground pattern for conducting the current from the device under test towards the first power supply unit, the first ground pattern being formed at a layer of the multi-layer substrate adjacent to the layer in order that the first ground pattern faces the first feed pattern, the first ground pattern having a same width as that of the first feed pattern, and the second wiring pattern includes a second feed pattern formed at a layer of the multi-layer substrate for conducting the current from the second power supply unit towards the device under test and a second ground pattern for conducting the current from the device under test towards the second power supply unit, the second ground pattern being formed at a layer of the multi-layer substrate adjacent to the layer in order that the second ground pattern faces the second feed pattern, the second ground pattern having a same width as that of the second feed pattern.

Each of the first and second power supply units may include a current detecting unit for detecting an amount of a voltage drop when the current generated by the first or second power supply unit passes through a predetermined resistor and a current controlling unit for controlling the current being supplied to the device under test in response to the amount of the voltage drop detected by the current detecting unit.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 3:
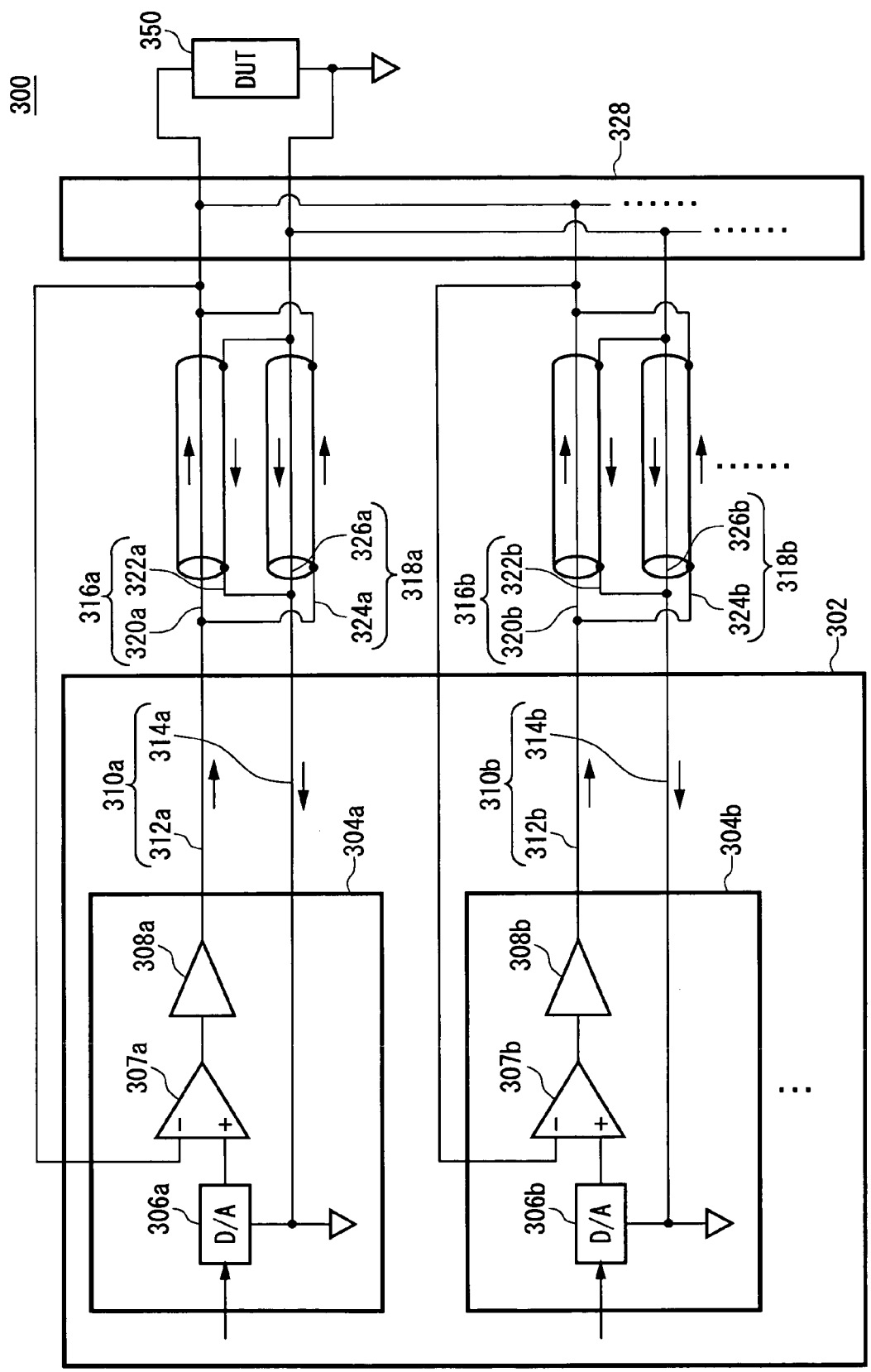
FIG. 3 shows an example of the configuration of a testing apparatus 300 according to an exemplary embodiment of the present invention.

FIG. 3 shows an example of the configuration of a testing apparatus 300 according to an exemplary embodiment of the present invention. The testing apparatus 300 uses coaxial cables for current transmission lines to supply high current required to the test to a device under test 350. The testing apparatus 300 detects the voltage applied to the device under test 350 when the current generated by a power supply unit is supplied to the device under test 350, so that it judges the quality of the device under test 350 based on the detected voltage. In addition, the testing apparatus 300 may detect the current applied to the device under test 350 when the voltage generated by a power supply unit is supplied to the device under test 350, so that it judges the quality of the device under test 350 based on the detected current.

The testing apparatus 300 includes power supply units 304a and 304b for generating currents to be supplied to the device under test 350, a multi-layer substrate 302 on which the power supply units 304a and 304b are provided, a wiring pattern 310a formed on the multi-layer substrate 302, by which the power supply unit 304a and the device under test 350 are electrically coupled to each other, a wiring pattern 310b formed on the multi-layer substrate 302, by which the power supply unit 304b and the device under test 350 are electrically coupled to each other, coaxial cables 316a and 318a through which the current generated by the power supply unit 304a is supplied to the device under test 350, coaxial cables 316b and 318b through which the current generated by the power supply unit 304b is supplied to the device under test 350, and a performance board 328 by which the coaxial cables 316a, 318a, 316b and 318b are electrically coupled to the device under test 350.

The power supply unit 304a includes a D/A converter 306a, an Op-Amp 307a, and a current output amplifier 308a. The D/A converter 306a converts the digital data supplied from a controlling apparatus such as a work station into an analog wave, and generates a voltage to be applied to the device under test 350. The Op-Amp 307a, an example of a voltage detecting unit of the present invention, compares the voltage generated by the D/A converter 306a to be applied to the device under test 350 and the voltage being practically applied to the device under test 350, and outputs the result of the comparison. Particularly, the Op-Amp 307a applies a voltage equivalent to the voltage generated by the D/A converter 306a to be applied to the device under test 350 from which the voltage being practically applied to the device under test 350 is subtracted to the current output amplifier 308a. The current output amplifier 308a generates a current to be supplied to the device under test 350 based on the voltage applied by the Op-Amp 307a.

The power supply unit 304b has the same configuration as that of the power supply unit 304a, i.e. includes a D/A converter 306b, an Op-Amp 307b, and a current output amplifier 308b. Each of these D/A converter 306b, Op-Amp 307b, and current output amplifier 308b may have the same configuration and function as those of the D/A converter 306a, Op-Amp 307a, and current output amplifier 308a respectively.

The wiring pattern 310a includes a feed pattern 312a and a ground pattern 314a, by which the power supply unit 304a and the coaxial cables 316a and 318a are electrically coupled to each other. The wiring pattern 310b includes a feed pattern 312b and a ground pattern 314b, by which the power supply unit 304b and the coaxial cables 316b and 318b are electrically coupled to each other.

The coaxial cable 316a includes internal and external conductors 320a and 322a, through which the wiring pattern 310a and the performance board 328 are electrically coupled to each other. In addition, the coaxial cable 318a includes internal and external conductors 326a and 324a, through which the wiring pattern 310a and the performance board 328 are electrically coupled to each other. In addition, the coaxial cable 316b includes internal and external conductors 320b and 322b, through which the wiring pattern 310b and the performance board 328 are electrically coupled to each other. In addition, the coaxial cable 318b includes internal and external conductors 324b and 326b, through which the wiring pattern 310b and the performance board 328 are electrically coupled to each other.

The feed pattern 312a conducts current from the power supply unit 304a towards the internal and external conductors 320a and 324a in order that the current generated by the current output amplifier 308a can be supplied to the device under test 350. In addition, the ground pattern 314a conducts current from the external and internal conductors 322a and 326a towards the power supply unit 304a. And, the feed pattern 312b conducts current from the power supply unit 304b towards the internal and external conductors 320b and 324b in order that the current generated by the current output amplifier 308b can be supplied to the device under test 350. In addition, the ground pattern 314b conducts current from the external and internal conductors 322b and 326b towards the power supply unit 304b.

The internal conductor 320a conducts the current supplied via the feed pattern 312a from the power supply unit 304a towards the device under test 350. And, the external conductor 322a is provided around the internal conductor 320a with an isolator interposed therebetween, and conducts current from the device under test 350 towards the power supply unit 304a. In addition, the internal conductor 326a conducts the current from the device under test 350 towards the power supply unit 304a. And, the external conductor 324a is provided around the internal conductor 326a with an isolator interposed therebetween, and conducts the current supplied via the feed pattern 312a from the power supply unit 304a towards the device under test 350. In other words, the internal and external conductors 320a and 324a coupled in parallel to each other conduct current from the power supply unit 304a towards the device under test 350, and the internal and external conductors 322a and 326a coupled in parallel to each other conduct current from the device under test 350 towards the power supply unit 304a.

The internal conductor 320b conducts the current supplied via the feed pattern 312b from the power supply unit 304b towards the device under test 350. And, the external conductor 322b is provided around the internal conductor 320b with an isolator interposed therebetween, and conducts current from the device under test 350 towards the power supply unit 304b. In addition, the internal conductor 326b conducts the current from the device under test 350 towards the power supply unit 304b. And, the external conductor 324b is provided around the internal conductor 326b with an isolator interposed therebetween, and conducts the current supplied via the feed pattern 312b from the power supply unit 304b towards the device under test 350. In other words, the internal and external conductors 320b and 324b coupled in parallel to each other conduct current from the power supply unit 304b towards the device under test 350, and the internal and external conductors 322b and 326b coupled in parallel to each other conduct current from the device under test 350 towards the power supply unit 304b.

The performance board 328 enables the internal and external conductors 320a and 324a and the internal and external conductors 320b and 324b to be electrically coupled to each other, so that the currents generated by the power supply units 304a and 304b can be supplied to the device under test 350. In addition, the performance board 328 enables the internal and external conductors 322a and 326a and the internal and external conductors 322b and 326b to be electrically coupled to each other, so that the currents generated by the power supply units 304a and 304b can be supplied to the device under test 350.

If the current generated by the power supply unit 304a is changed, the magnetic flux generated from the internal conductor 320a is changed due to the change in the current flowing through the internal conductor 320a. Accordingly, there occurs a self-induced electromotive force in the internal conductor 320a. The generated self-induced electromotive force acts from the device under test 350 towards the power supply unit 304a, i.e. so as to conduct current in the opposite direction to the current flowing through the internal conductor 320a. And, if the current generated by the power supply unit 304a is changed, the magnetic flux generated from the external conductor 322a is changed due to the change in the current flowing through the external conductor 322a. Accordingly, the magnetic flux crossing the internal conductor 320a is changed, and thereby there occurs a mutually induced electromotive force in the internal conductor 320a. The generated mutually induced electromotive force acts from the power supply unit 304a towards the device under test 350, i.e. so as to conduct current in the same direction as the current flowing through the internal conductor 320a. Therefore, the mutually induced electromotive force generated in the internal conductor 320a acts to offset the self-induced electromotive force generated in the internal conductor 320a. In other words, the self-inductance in the internal conductor 320a is substantially reduced. Consequently, the response characteristics of the output current to the change in the input current in the internal conductor 320a are improved.

And, if the current generated by the power supply unit 304a is changed, the magnetic flux generated from the external conductor 322a is changed due to the change in the current flowing through the external conductor 322a. Accordingly, there occurs a self-induced electromotive force in the external conductor 322a. The generated self-induced electromotive force acts from the power supply unit 304a towards the device under test 350, i.e. so as to conduct current in the opposite direction to the current flowing through the internal conductor 322a. And, if the current generated by the power supply unit 304a is changed, the magnetic flux generated from the internal conductor 320a is changed due to the change in the current flowing through the internal conductor 320a. Accordingly, the magnetic flux crossing the external conductor 322a is changed, and thereby there occurs a mutually induced electromotive force in the external conductor 322a. The generated mutually induced electromotive force acts from the device under test 350 towards the power supply unit 304a, i.e. so as to conduct current in the same direction as the current flowing through the external conductor 322a. Therefore, the mutually induced electromotive force generated in the external conductor 322a acts to offset the self-induced electromotive force generated in the external conductor 322a. In other words, the self-inductance in the external conductor 322a is substantially reduced. Consequently, the response characteristics of the output current to the change in the input current in the external conductor 322a are improved.

In the same way, the self-inductance with regard to each of the internal and external conductors 326a, 324a, 320b, 322b, 324b and 326b is substantially reduced, and the response characteristics of the output current to the change in the input current with respect to each of the internal and external conductors 326a, 324a, 320b, 322b, 324b and 326b are improved.

As above, according to the testing apparatus 300 related to the present embodiment, since the response characteristics of the output current to the change in the input current with respect to coaxial cables can be improved, it is possible to test the device under test 350 with high precision, even though a significant change in current is necessary, e.g. when a current of 100 A should be generated with a rise time of 2 μs. In addition, according to the testing apparatus 300 related to the present embodiment, a high current generated by a plurality of power supply units can be supplied to perform a test, while the plurality of power supply units including the power supply units 304a and 304b are coupled in parallel.

Figure 4:
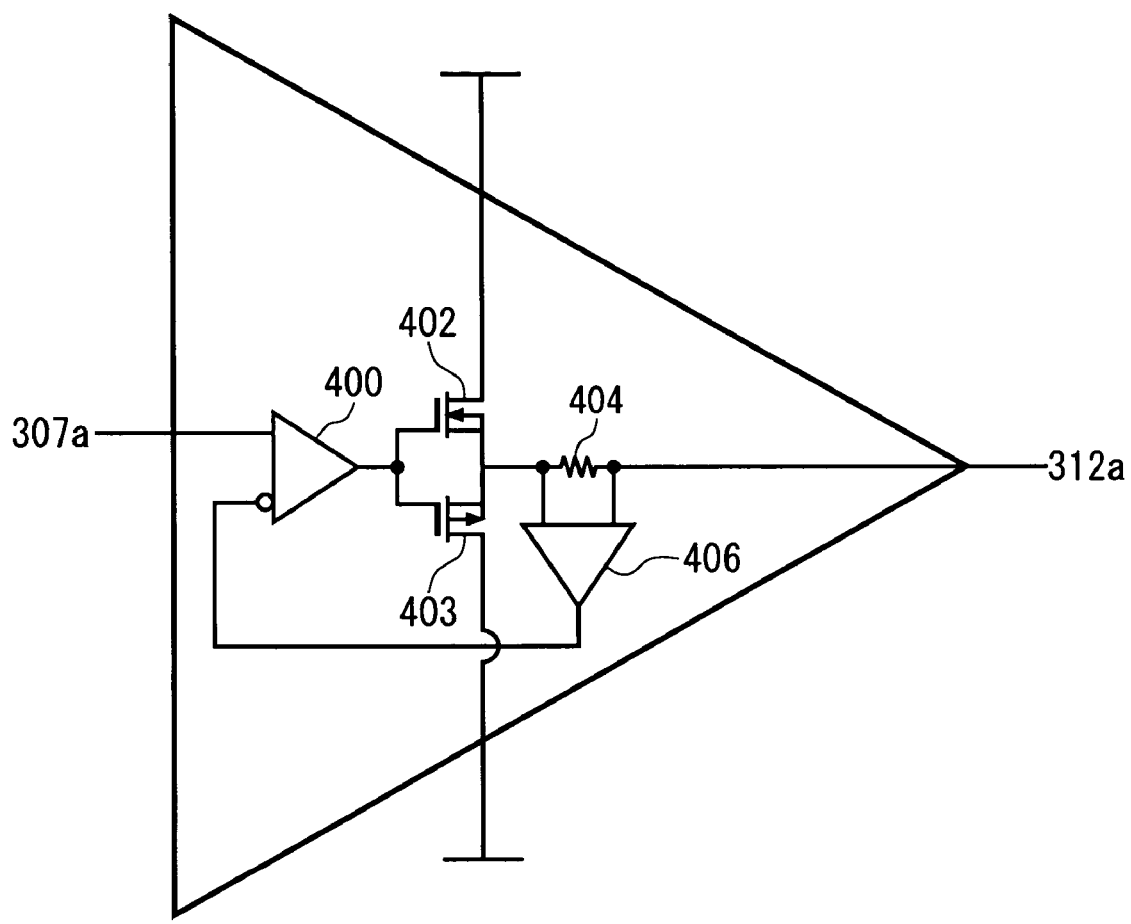
FIG. 4 shows an example of the configuration of a current output amplifier 308a related to this embodiment.

FIG. 4 shows an example of the configuration of the current output amplifier 308a related to this embodiment. The current output amplifier 308a includes a current controlling unit 400, field effect transistors 402 and 403, a resistor 404 and a current detecting unit 406.

The current detecting unit 406 detects the amount of a voltage drop when the current generated by the current output amplifier 308a in the power supply unit 304a and supplied to the feed pattern 312a passes through the resistor 404. And, the current controlling unit 400 controls the current being supplied to the device under test 350 in response to the comparison result outputted by the Op-Amp 307a, i.e. the voltage applied by the Op-Amp 307a and the amount of the voltage drop detected by the current detecting unit 406. Particularly, the current controlling unit 400 inputs a voltage, which is equivalent to the voltage applied by the Op-Amp 307a to which the amount of the voltage drop detected by the current detecting unit 406 is added, to the field effect transistors 402 and 403 so as to control the current outputted by the field effect transistors 402 and 403. In other words, the current controlling unit 400 controls the current supplied to the device under test 350 in order to negate the amount of the voltage drop across the resistor 404. Accordingly, the current output amplifier 308a can generate a desired current with stability regardless of the resistor 404.

Figure 5:
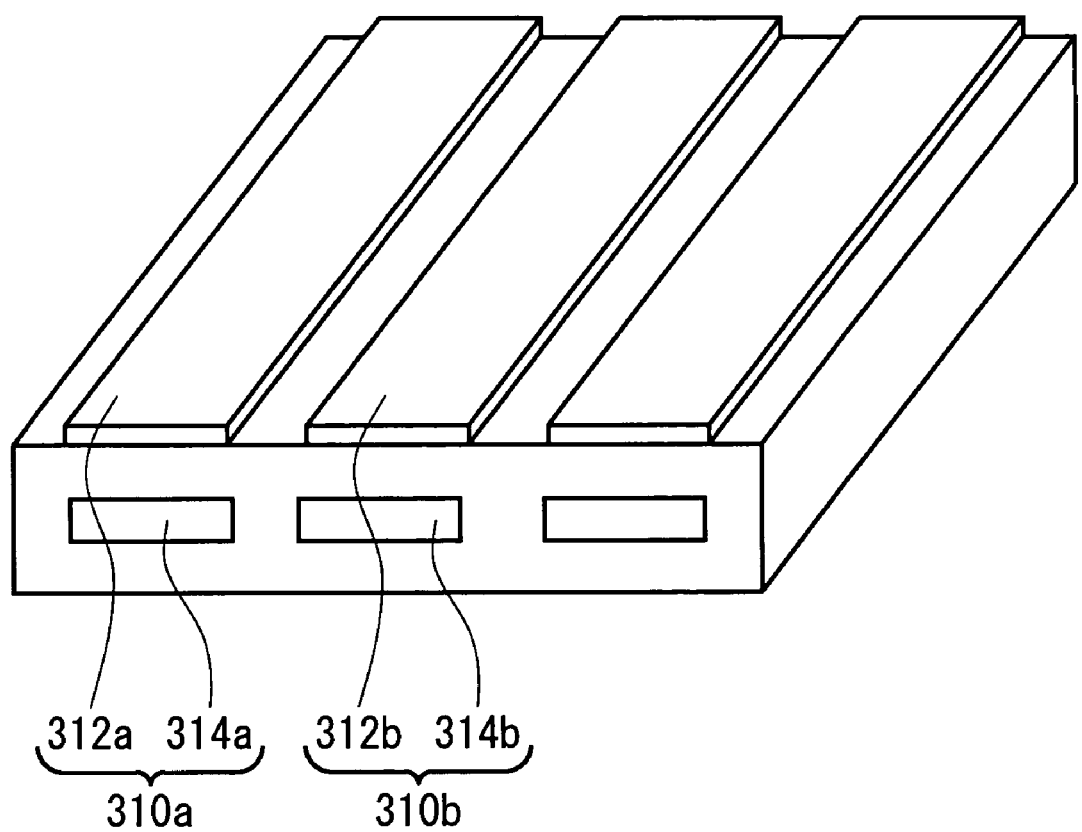
FIG. 5 shows an example of the configuration of a multi-layer substrate 302.

FIG. 5 shows an example of the configuration of the multi-layer substrate 302. In the multi-layer substrate 302, a plurality of wiring patterns including the wiring pattern 310a having the feed and ground patterns 312a and 314a and the wiring pattern 310b having the feed and ground patterns 312b and 314b are formed. The feed patterns 312a and 312b are formed at a surface layer of the multi-layer substrate 302 to be isolated from each other, and the ground patterns 314a and 314b are formed at an internal layer of the multi-layer substrate 302 to be isolated from each other. In another embodiment, the feed patterns 312a and 312b may be formed at an internal layer of the multi-layer substrate 302 to be isolated from each other, and the ground patterns 314a and 314b may be formed at a surface layer of the multi-layer substrate 302 to be isolated from each other.

The feed pattern 312a conducts current from the power supply unit 304a towards the internal and external conductors 320a and 324a, and the ground pattern 314a conducts current from the external and internal conductors 322a and 326a towards the power supply unit 304a. In addition, the feed pattern 312b conducts current from the power supply unit 304b towards the internal and external conductors 320b and 324b, and the ground pattern 314b conducts current from the external and internal conductors 322b and 326b towards the power supply unit 304b.

The feed patterns 312a and 312b are formed at a first layer of the multi-layer substrate, and the ground patterns 314a and 314b are formed at a second layer of the multi-layer substrate adjacent to the first layer with an isolation layer interposed therebetween. In addition, the ground pattern 314a is formed at the second layer adjacent to the first layer, at which the feed pattern 312a is formed, in order that the ground pattern 314a faces the feed pattern 312a with the same width as the feed pattern 312a.

Further, each of the power supply units 304a and 304b preferably applies the same collector supply voltage to the feed patterns 312a and 312b, and the same drain supply voltage to the ground patterns 314a and 314b.

If the current generated by the power supply unit 304a is changed, the magnetic flux generated from the feed pattern 312a is changed due to the change in the current flowing through the feed pattern 312a. Accordingly, there occurs a self-induced electromotive force in the feed pattern 312a. The generated self-induced electromotive force acts from the device under test 350 towards the power supply unit 304a, i.e. so as to conduct current in the opposite direction to the current flowing through the feed pattern 312a. And, if the current generated by the power supply unit 304a is changed, the magnetic flux generated from the ground pattern 314a is changed due to the change in the current flowing through the ground pattern 314a. Accordingly, the magnetic flux crossing the feed pattern 312a is changed, and thereby there occurs a mutually induced electromotive force in the feed pattern 312a. The generated mutually induced electromotive force acts from the power supply unit 304a towards the device under test 350, i.e. so as to conduct current in the same direction as the current flowing through the feed pattern 312a. Therefore, the mutually induced electromotive force generated in the feed pattern 312a acts to offset the self-induced electromotive force generated in the feed pattern 312a. In other words, since the feed and ground patterns 312a and 314a are facing each other with the same width, the self-inductance in the feed pattern 312a is substantially reduced. Consequently, the response characteristics of the output current to the change in the input current in the feed pattern 312a are improved.

In addition, if the current generated by the power supply unit 304a is changed, the magnetic flux generated from the ground pattern 314a is changed due to the change in the current flowing through the ground pattern 314a. Accordingly, there occurs a self-induced electromotive force in the ground pattern 314a. The generated self-induced electromotive force acts from the power supply unit 304a towards the device under test 350, i.e. so as to conduct current in the opposite direction to the current flowing through the ground pattern 314a. And, if the current generated by the power supply unit 304a is changed, the magnetic flux generated from the feed pattern 312a is changed due to the change in the current flowing through the feed pattern 312a. Accordingly, the magnetic flux crossing the ground pattern 314a is changed, and thereby there occurs a mutually induced electromotive force in the ground pattern 314a. The generated mutually induced electromotive force acts from the device under test 350 towards the power supply unit 304a, i.e. so as to conduct current in the same direction as the current flowing through the ground pattern 314a. Therefore, the mutually induced electromotive force generated in the ground pattern 314a acts to offset the self-induced electromotive force generated in the ground pattern 314a. In other words, since the feed and ground patterns 312a and 314a are facing each other with the same width, the self-inductance in the ground pattern 314a is substantially reduced. Consequently, the response characteristics of the output current to the change in the input current in the ground pattern 314a are improved.

In the same way, the self-inductance with respect to each of the feed and ground patterns 312b and 314b is substantially reduced, and thereby the response characteristics of the output current to the change in the input current in each of the feed and ground patterns 312b and 314b are improved.

As above, according to the multi-layer substrate 302 related to the present embodiment, since the response characteristics of the output current to the change in the input current with respect to the wiring pattern can be improved, it is possible to test the device under test 350 with high precision, even though a significant change in current is necessary, e.g. when a current of 100 A should be generated with a rise time of 2 μs.

Figure 6:
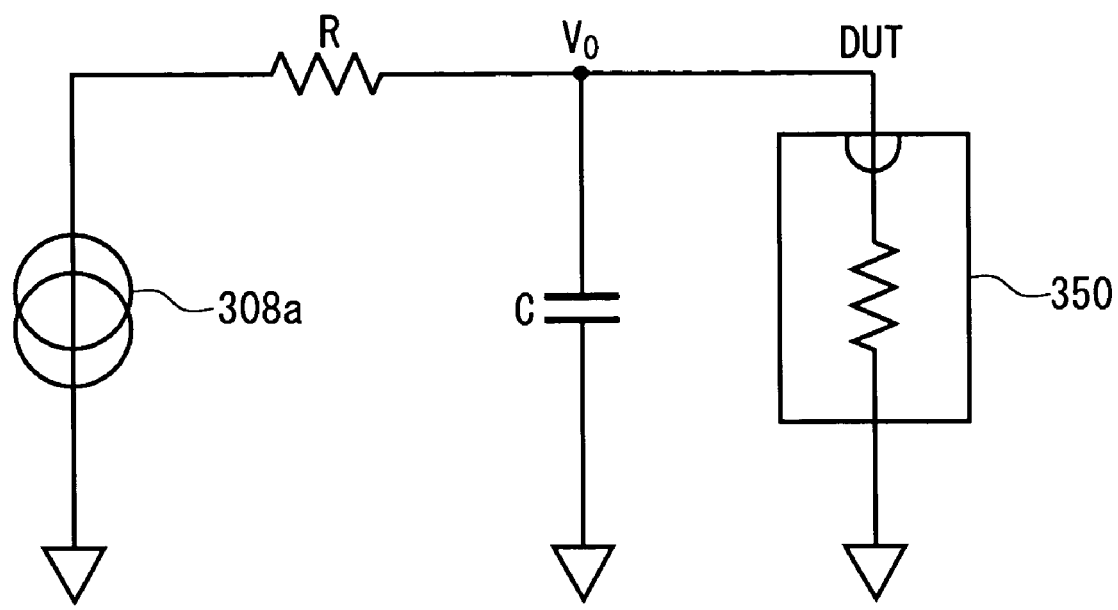
FIG. 6 shows the equivalent circuit of a testing apparatus 300.
Figure 7:
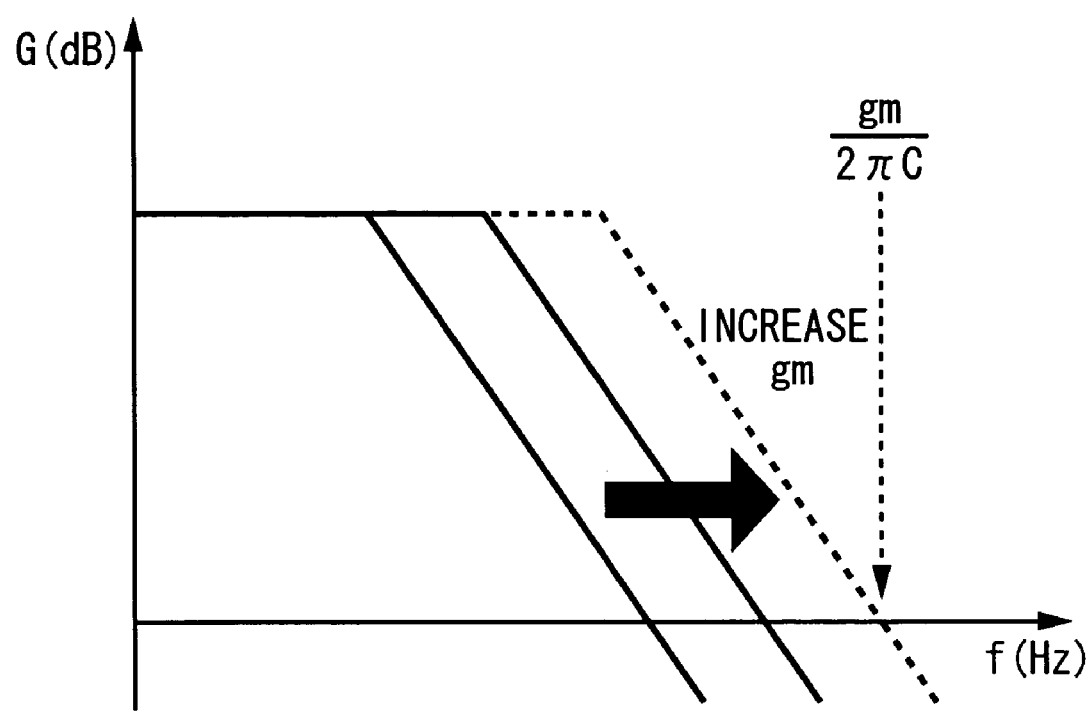
FIG. 7 shows the frequency response characteristics of a voltage $V_O$ applied by the testing apparatus 300.

FIG. 6 shows the equivalent circuit of a testing apparatus 300 related to the present embodiment. And, FIG. 7 shows the frequency response characteristics of a voltage $V_0$ applied to the device under test 350 by the testing apparatus 300 shown in FIG. 6. And, FIG. 8 shows the frequency response characteristics of the applied voltage $V_0$ with consideration of the resonance frequency of the equivalent circuit of the testing apparatus 300.

The testing apparatus 300 performs a test of the device under test 350 by supplying current and applying the voltage $V_0$ to the device under test 350 using a current output amplifier 308a. Here, as shown in FIG. 7, since the gain bandwidth (GBW) product of the current output amplifier 308a is calculated by $gm/(2\pi C)$ [Hz], where gm represents the mutual conductance of the current output amplifier 308a, it is desirable that the mutual conductance gm should be large for realizing a high speed test.

Figure 1:
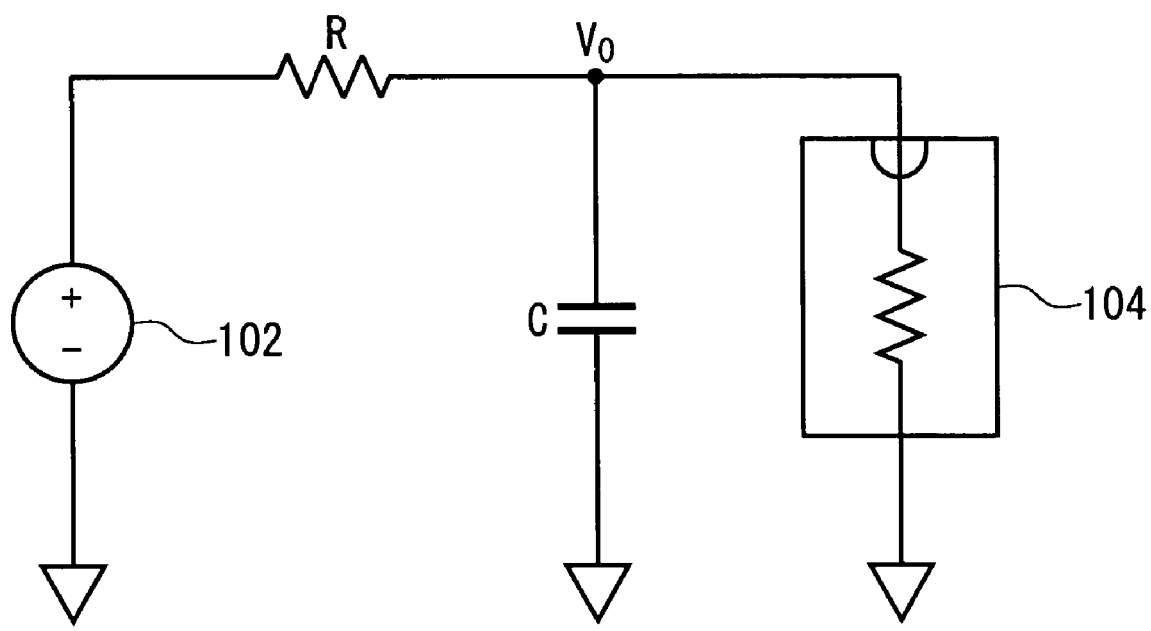
FIG. 1 shows an equivalent circuit of a testing apparatus 100 according to the prior art.
Figure 2:
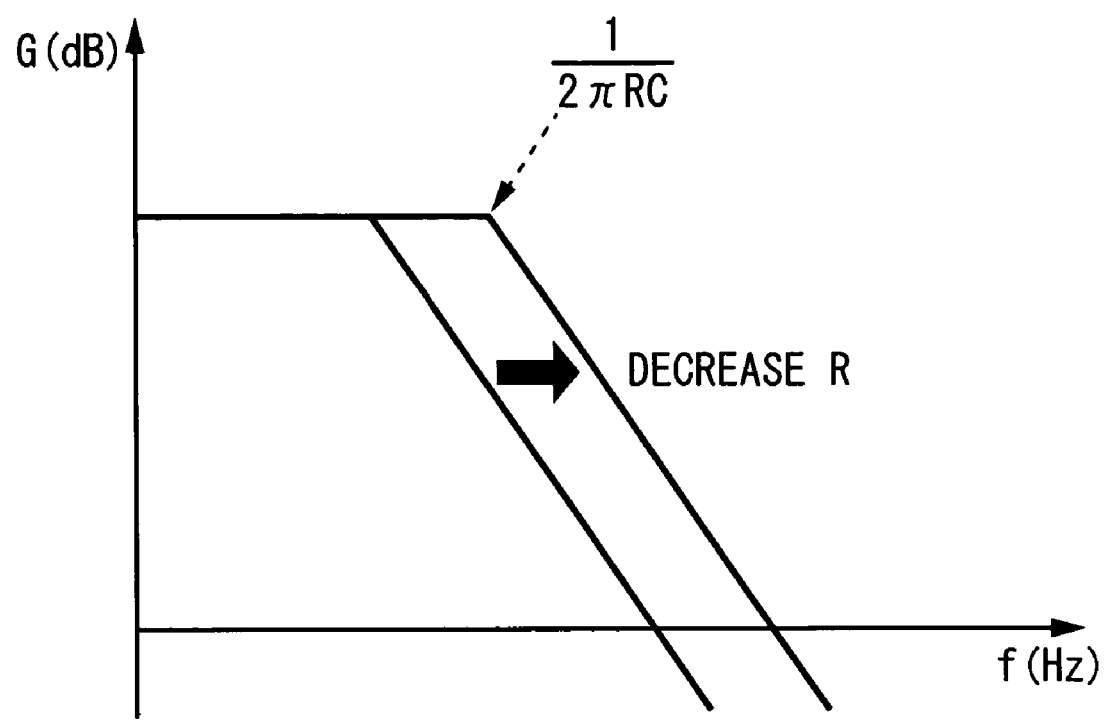
FIG. 2 shows the frequency response characteristics of a voltage $V_O$ applied by in the testing apparatus 100.

As described in relation to FIGS. 1 and 2, although it is difficult to lower the resistance R sufficiently and there is a limit in a high speed test with the testing apparatus 100 adopting the voltage output amplifier 102, by contrast, it is easy to perform a high speed test and the sufficiently high speed load response can be realized with the testing apparatus 300 adopting the current output amplifier 308a, because it is easy to increase the mutual conductance gm.

Figure 8:
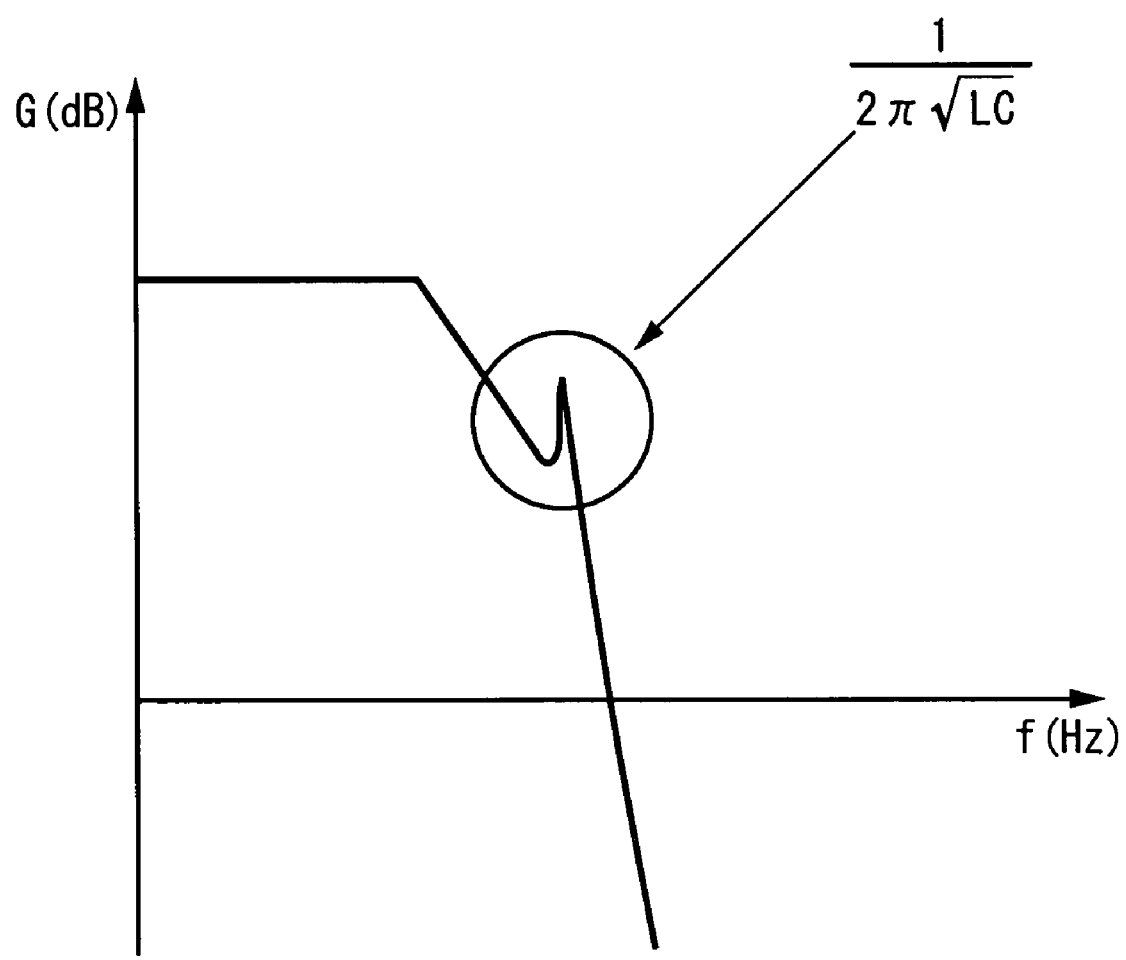
FIG. 8 shows the frequency response characteristics of the applied voltage V0 with consideration of the resonance frequency of the equivalent circuit of the testing apparatus 300.

In addition, as shown in FIG. 8, if the resonance frequency of the equivalent circuit of the testing apparatus 300 calculated by $1/(2\pi\sqrt{LC})$ [Hz] exists within a band used for the test of the device under test 350, the device under test 350 cannot be supplied with current with stability. Accordingly, the resonance frequency should be increased to the band not used for the test of the device under test 350, and thus it is necessary to lower the self-inductance.

In the testing apparatus 300 of this embodiment as described in relation to FIG. 3, the self-inductance with regard to the coaxial cables 316a, 318a, 316b and 318b can be sufficiently reduced, and as described in relation to FIG. 5 the self-inductance with regard to the wiring patterns 310a and 310b can be sufficiently reduced. Therefore, since the resonance frequency can be increased to the band not used for the test of the device under test 350, the device under test 350 can be supplied with current with stability, and thereby it is possible to test the device under test 350 with high precision.

Although the present invention has been described by way of exemplary embodiments, it should be understood that those skilled in the art might make many changes and substitutions without departing from the spirit and the scope of the present invention which is defined only by the appended claims.

What is claimed is:

1. A testing apparatus for testing a device under test by supplying a current to said device under test, comprising:
   a first power supply unit for generating a current to be supplied to said device under test; and
   first and second coaxial cables through which said current generated by said first power supply unit is supplied to said device under test,
   wherein said first power supply unit comprises:
   a current detecting unit for detecting an amount of a voltage drop when said current generated by said first power supply unit passes through a predetermined resistor; and
   a current controlling unit for controlling said current being supplied to said device under test in response to said amount of said voltage drop detected by said current detecting unit,
   said first coaxial cable comprises:
   a first internal conductor for conducting said current from said first power supply unit towards said device under test; and
   a first external conductor provided around said first internal conductor with an insulator interposed therebetween for conducting said current from said device under test towards said first power supply unit, and
   said second coaxial cable comprises:
   a second internal conductor for conducting said current from said device under test towards said first power supply unit; and
   a second external conductor around said second internal conductor with an insulator interposed therebetween for conducting said current from said first power supply unit towards said device under test, wherein
   said first internal conductor, said first external conductor, said second internal conductor, and said second external conductor are connected to said device under test.

2. A testing apparatus as claimed in claim 1, wherein said current controlling unit controls said current supplied to said device under test so as to negate said amount of said voltage drop caused by said predetermined resistor.

3. A testing apparatus as claimed in claim 1 further comprising:
   a voltage detecting unit for comparing a voltage to be applied to said device under test with a voltage being practically applied to said device under test and outputting a comparison result thereof,
   wherein said current controlling unit controls said current supplied to said device under test further based on said comparison result outputted by said voltage detecting unit.

4. A testing apparatus for testing a device under test by supplying a current to said device under test, comprising:
   a first power supply unit for generating a current to be supplied to said device under test; and
   first and second coaxial cables through which said current generated by said first power supply unit is supplied to said device under test;
   wherein said first power supply unit comprises:
   a current detecting unit for detecting an amount of a voltage drop when said current generated by said first power supply unit passes through a predetermined resistor; and
   a current controlling unit for controlling said current being supplied to said device under test in response to said amount of said voltage drop detected by said current detecting unit,
   said first coaxial cable comprises:
   a first internal conductor for conducting said current from said first power supply unit towards said device under test; and
   a first external conductor provided around said first internal conductor with an insulator interposed therebetween for conducting said current from said device under test towards said first power supply unit, and
   said second coaxial cable comprises:
   a second internal conductor for conducting said current from said device under test towards said first power supply unit; and
   a second external conductor around said second internal conductor with an insulator interposed therebetween for conducting said current from said first power supply unit towards said device under test, wherein
   said first internal and second external conductors are coupled in parallel to each other and conduct said current from said first power supply unit towards said device under test, and
   said first external and second internal conductors are coupled in parallel to each other and conduct said current from said device under test towards said first power supply unit.

5. A testing apparatus for testing a device under test by supplying a current to said device under test, comprising:
   a first power supply unit for generating a current to be supplied to said device under test; and
   first and second coaxial cables through which said current generated by said first power supply unit is supplied to said device under test
   wherein said first power supply unit comprises:
   a current detecting unit for detecting an amount of a voltage drop when said current generated by said first power supply unit passes through a predetermined resistor; and
   a current controlling unit for controlling said current being supplied to said device under test in response to said amount of said voltage drop detected by said current detecting unit,
   said first coaxial cable comprises:
   a first internal conductor for conducting said current from said first power supply unit towards said device under test; and
   a first external conductor provided around said first internal conductor with an insulator interposed therebetween for conducting said current from said device under test towards said first power supply unit, and
   said second coaxial cable comprises:
   a second internal conductor for conducting said current from said device under test towards said first power supply unit; and
   a second external conductor around said second internal conductor with an insulator interposed therebetween for conducting said current from said first power supply unit towards said device under test;
   the test apparatus further comprising:
   a second power supply unit with a same configuration as that of said first power supply unit for generating a current to be supplied to said device under test;
   third and fourth coaxial cables through which said current generated by said second power supply unit is supplied to said device under test;
   a multi-layer substrate on which said first and second power supply units are provided;
   a first wiring pattern formed at said multi-layer substrate for electrically coupling said first power supply unit to said first and second coaxial cables; and
   a second wiring pattern formed at said multi-layer substrate for electrically coupling said second power supply unit to said third and fourth coaxial cables,
   wherein said third coaxial cable comprises:
   a third internal conductor for conducting said current from said second power supply unit towards said device under test; and
   a third external conductor provided around said third internal conductor with an insulator interposed therebetween for conducting said current from said device under test towards said second power supply unit,
   said fourth coaxial cable comprises:
   a fourth internal conductor for conducting said current from said device under test towards said second power supply unit; and
   a fourth external conductor provided around said fourth internal conductor with an insulator interposed therebetween for conducting said current from said second power supply unit towards said device under test,
   said first wiring pattern comprises:
   a first feed pattern formed at a layer of said multi-layer substrate for conducting said current from said first power supply unit towards said first internal and second external conductors; and
   a first ground pattern for conducting said current from said first external and second internal conductors towards said first power supply unit, said first ground pattern being formed at a layer of said multi-layer substrate adjacent to said layer in order that said first ground pattern faces said first feed pattern, said first ground pattern having a same width as that of said first feed pattern, and
   said second wiring pattern comprises:
   a second feed pattern formed at a layer of said multi-layer substrate for conducting said current from said second power supply unit towards said third internal and fourth external conductors; and a second ground pattern for conducting said current from said third external and fourth internal conductors towards said second power supply unit, said second ground pattern being formed at a layer of said multi-layer substrate adjacent to said layer in order that said second ground pattern faces said second feed pattern, said second ground pattern having a same width as that of said second feed pattern.

6. A testing apparatus as claimed in claim 5, wherein said first and second feed patterns are formed at a first layer of said multi-layer substrate, and said first and second ground patterns are formed at a second layer of said multi-layer substrate, said second layer being adjacent to said first layer with an insulation layer interposed there between.

7. A testing apparatus as claimed in claim 5, wherein each of said first and second power supply units applies a first same voltage to each of said first and second feed patterns, and a second same voltage to each of said first and second ground patterns.

8. A testing apparatus as claimed in claim 7 further comprising:

a performance board for coupling said first to fourth coaxial cables electrically, wherein said performance board electrically couples said first internal and second external conductors to said third internal and fourth external conductors, and said first external and second internal conductors to said third external and fourth internal conductors.

* * * * *